United States Patent
Chien (10) Patent No.: US 6,510,069 B2
(45) Date of Patent: Jan. 21, 2003

(54) CONTENT ADDRESSABLE MEMORY APPARATUS AND METHOD OF OPERATING THE SAME

(76) Inventor: Pien Chien, No. 144, Chi-Long Rd., Sec. 3, Taipei (TW)

(*) Notice: Subject to any disclaimer, the term of this patent is extended or adjusted under 35 U.S.C. 154(b) by 14 days.

(21) Appl. No.: 09/895,555

(22) Filed: Jun. 28, 2001

(65) Prior Publication Data

US 2002/0097595 A1 Jul. 25, 2002

Related U.S. Application Data

(60) Provisional application No. 60/262,989, filed on Jan. 19, 2001.

(51) Int. Cl.[7] ............................................. G11C 15/00
(52) U.S. Cl. .................... 365/49; 365/227; 365/189.07; 365/230.06; 365/239
(58) Field of Search ...................... 365/49, 227, 189.07, 365/230.06, 239

(56) References Cited

U.S. PATENT DOCUMENTS

| | | | | | |
|---|---|---|---|---|---|
| 4,377,855 A | * | 3/1983 | Lavi | ............................ | 365/202 |
| 4,758,982 A | * | 7/1988 | Price | ............................ | 365/49 |
| 5,226,005 A | * | 7/1993 | Lee et al. | ............... | 365/189.07 |
| 5,592,407 A | * | 1/1997 | Konishi et al. | ......... | 365/189.07 |
| 5,715,188 A | * | 2/1998 | Covino et al. | ............... | 365/201 |
| 5,995,401 A | * | 11/1999 | Schultz et al. | .......... | 365/189.07 |
| 6,061,262 A | * | 5/2000 | Schultz et al. | .......... | 365/189.07 |
| 6,215,685 B1 | * | 4/2001 | Fung et al. | .................... | 365/49 |
| 6,240,000 B1 | * | 5/2001 | Sywyk et al. | ........... | 365/189.05 |
| 6,307,798 B1 | * | 10/2001 | Ahmed et al. | .......... | 365/189.07 |

\* cited by examiner

*Primary Examiner*—Richard Elms
*Assistant Examiner*—Tuan T. Nguyen
(74) *Attorney, Agent, or Firm*—J.C. Patents (57) ABSTRACT

An apparatus and an operation method of a content addressable memory (CAM). The content addressable memory has a memory array and a frequency multiplier. The memory array has a memory cell row, which has a plurality of memory portions and a tag-compare portion. Each memory portion is used to store bit data. The tag-compare portion receives a compare data signal, which is compared to the bit data stored in all the memory portions. The memory portions are connected to the tag-compare portion in parallel. The frequency multiplier receives an external drive signal, and outputs an internal compare signal after multiplying a frequency of the drive signal with a certain numeric. The tag-compare portion sequentially compares the compare data signal with the bit data stored in each memory portion according to the clock of the internal compare signal, and outputs a match signal.

25 Claims, 6 Drawing Sheets

CONTENT ADDRESSABLE MEMORY APPARATUS AND METHOD OF OPERATING THE SAME

CROSS-REFERENCE TO RELATED APPLICATION

This application claims the priority benefit of U.S.A. provisional application serial No. 60/262,989, filed on Jan. 19, 2001. The disclosure of the application is incorporated herein by reference.

BACKGROUND OF THE INVENTION

1. Field of the Invention

The invention relates in general to a content addressable memory (CAM) apparatus and a method of operating the same, and more particularly, to a content addressable memory (CAM) apparatus and a method of operating the same that can reduce the operation power consumption and the fabrication cost.

2. Description of the Related Art

The content addressable memory is a kind of storage apparatus for comparing specific data with the data stored in a CAM array. The whole CAM array or block is able to perform a parallel comparison with comparand data. Therefore, the comparison speed is fast, and the efficiency is promising. After parallel comparison, if the data stored in the CAM matches, the CAM apparatus outputs a match flag signal. Conversely, if no matched data is found, the CAM apparatus stores the comparand data into one of the idle memories of the CAM array.

Conventionally, the comparison between the comparand data and the data stored in the CAM array, and the refresh process of the non-iterate data (that is, the data not located in the CAM array is stored in the empty memory) require many commands and clock cycles to complete.

Figure 1:
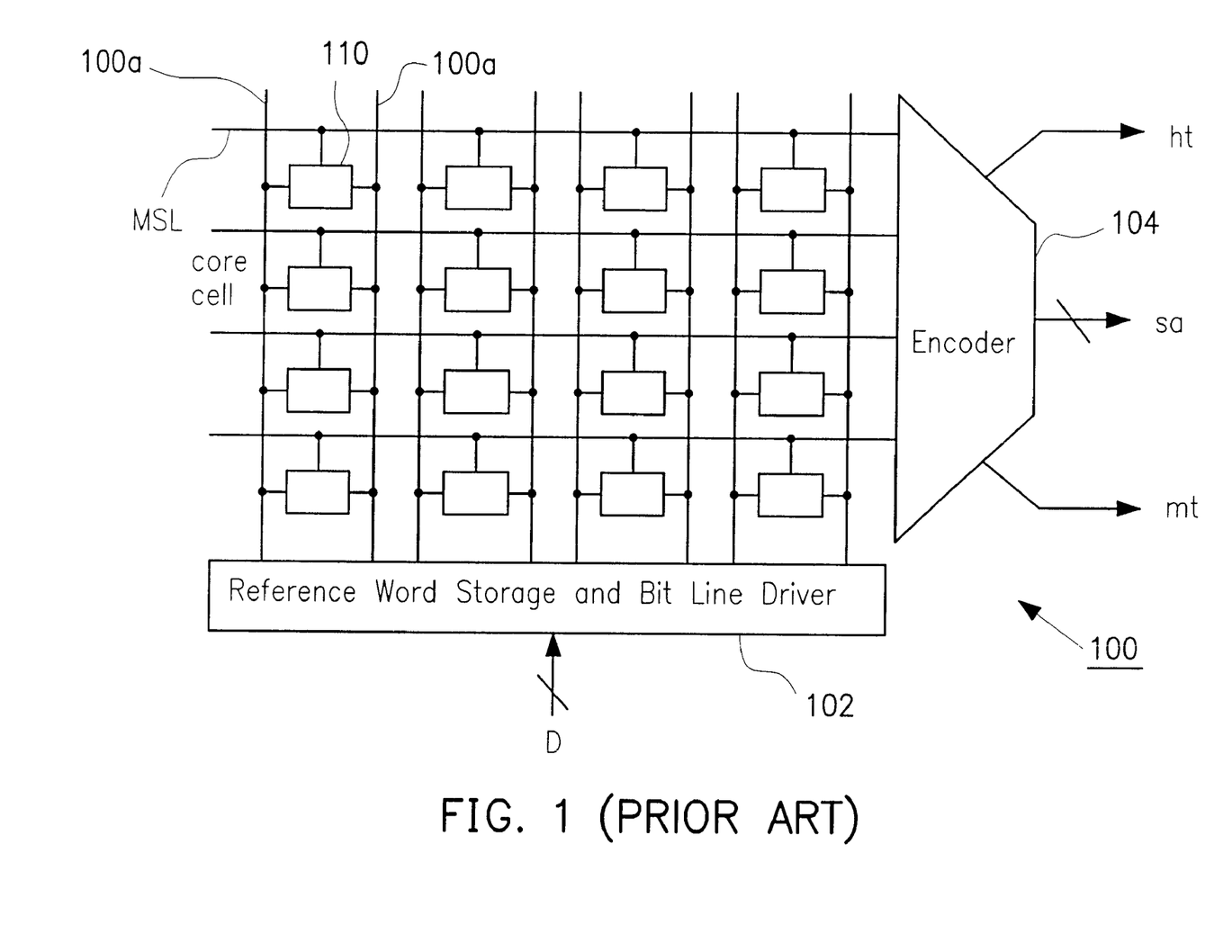
FIG. 1 shows a conventional CAM apparatus.

FIG. 1 shows a conventional CAM array 100 that includes 4 rows (4 words) and 4 columns (4 bits) with 16 core cells, 110 in total. Each core cell 110 includes a data storage apparatus (not shown) and a pair of bit lines 100a. The pair of bit lines 100a is used to transmit different data of one single bit instead of transmitting two-bit data. That is, if one bit line 100a carries a high potential level (logic 1), the other bit line 100a carries a low potential level (logic 0).

In addition, to store the data of one single bit, each core cell further performs a single bit compare operation (logic exclusive NOR comparison (XNOR)). All the bit lines 100a are connected to the reference word storage and bit line driver 102 to transmit different data. When the reference word storage and bit line driver 102 receive the parallel input data D and transmit the data to the memory cell of the CAM array 100, the compare operation is complete. The CAM array 100 includes an encoder 104, which is coupled to all the matching sense lines (MSL) to receive all the match flag signals.

Figure 2:
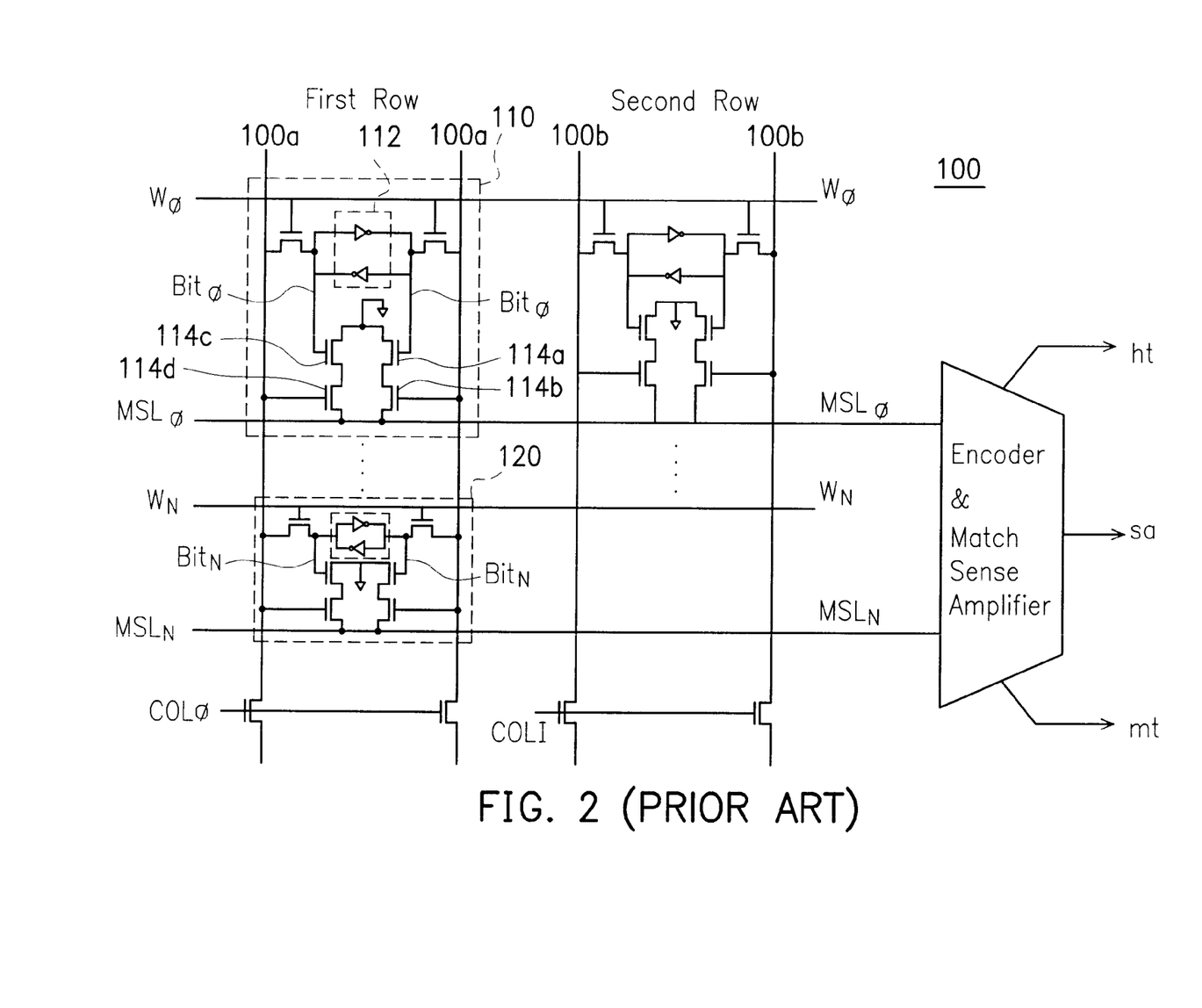
FIG. 2 is a detailed diagram of the conventional CAM apparatus as show in FIG. 1.

The detailed operation method of the CAM apparatus is described in FIG. 2. Each row comprises N CAM cells. Each CAM cell is divided into two portions. One is the static random memory cell (SRAM) portion, and the other is the tag-compare portion such as the transistors 114a to 114d. Such portion has the function to perform XOR (exclusive OR) on the data input from the bit lines 100a and the data stored in the SRAM (such as BIT0 and $\overline{BIT0}$ as shown in FIG. 2).

However, this conventional CAM apparatus has many drawbacks. For example, for the first row illustrated in FIG. 2, all the word lines ($WL_0, WL_1, \ldots, WL_N$) corresponding to N CAM cells have to be turned on if a comparison operation is performed on the bit data of the input bit line 100a. Therefore, a great amount of power is consumed. If the comparison operation is performed on the memory cells of all the rows, the power consumption for the memory is extremely high. Such CAM apparatus is not applicable for the more and more commonly used low supply voltage apparatus.

SUMMARY OF THE INVENTION

The invention provides a content addressable memory (CAM) apparatus and a method of operating the CAM apparatus that can reduce the operation power consumption and production cost.

The CAM apparatus and the method of operating the same provided by the invention can process many CAM arrays in parallel, so that the operation efficiency is greatly enhanced.

The CAM apparatus comprises a memory array and a frequency multiplier. The memory array comprises a memory cell row, which further comprises a plurality of memory portions and a tag-compare portion. Each of the memory portions is used to store bit data. The tag-compare portion is used to receive a compare data signal, and to compare the compare data signal with the bit data stored in all the memory portions. The memory portions are connected to the tag-compare portion in parallel. The frequency multiplier is used to receive an external drive signal, and to output an internal compare signal after multiplying the drive signal with a certain numeric. The tag-compare portion sequentially compares the compare data signal with the bit data stored in each memory portion according to the clock of the internal compare signal, that is, the internal compare clock, and then outputs a match signal.

The above CAM apparatus comprises a plurality of word lines. Each of the word lines is connected to the memory portion corresponding to the memory cell row. Via the word lines, the electric connection between the memory portions and the tag-compare portion is attained according to the internal compare clock.

The above CAM apparatus further comprises a match register to receive and temporarily store the match signal.

The above CAM apparatus further comprises a match sense amplifier located between the memory cell row and the match register to sense and receive the match signal. The match sense amplifier then outputs the match signal, which is then amplified thereby.

In the above CAM apparatus, the memory portions include a static random access memory (SRAM). The SRAM comprises two transistors and a capacitor, or a transistor and a capacitor. With these two structures, the SRAM may further comprise a refresh line coupled to all the memory portions. Via the refresh operation, the data stored in the SRAM is maintained.

The invention further provides an operation method of the CAM apparatus. The CAM apparatus comprises at least a memory cell row, which comprises a plurality of memory portions and a tag-compare portion. The tag-compare portion receives a compare data signal. The operation method comprises receiving a drive signal and outputting an internal compare signal after multiplying the drive signal by a predetermined numeric. According the clock of the internal compare signal, the tag-compare portion sequentially compares the compare data signal and the bit data stored in each memory portion, and outputs a match signal.

In the above method, the CAM apparatus further comprises a plurality of word lines, each of which is connected to the memory portion corresponding to the respective memory cell row. Via the word lines, the electric connections between the memory portions and the tag-compare portion are attained according to the clock of the internal compare signal.

In the above method, the memory portions include a SRAM, which may comprises two transistors and a capacitor, or a transistor and a capacitor. With these two structures, the memory portions further comprise a refresh line coupled to all the memory portions. The data stored in the SRAM is retained by the refresh operation.

Both the foregoing general description and the following detailed description are exemplary and explanatory only and are not restrictive of the invention, as claimed.

DESCRIPTION OF THE PREFERRED EMBODIMENTS

The invention relates a content addressable memory (CAM) apparatus and a method of operating the CAM apparatus. The CAM apparatus and the operation method thereof can reduce the operation power consumption and the fabrication cost.

In the CAM apparatus provided by the invention, the clock of the external signal, that is, the external compare clock, is partitioned into a plurality of clock signals while receiving the signal for performing compare operation, that is, while entering the compare mode. The partition method includes multiplying the frequency of the received signal. The number of clock signals is equal to the number of the CAM cells in each row of the CAM array.

For example, if each row comprises N CAM cells, that is, the clock of the received external compare drive signal, that is, the received external compare drive clock, is partitioned into N clock signals and the frequency of the compare drive signal is multiplied by N. Meanwhile, the compare drive clock is converted to an internal compare clock used by the CAM apparatus. According to the internal compare clock, the N CAM cells in the same memory cell row turn on the word line WL corresponding to the CAM cells one by one. For example, the first internal compare clock turns on a first word line $WL_0$, and is compared to the first CAM cell by the input signal. Accordingly, the Nth internal compare clock turns on the Nth word line, and is compared to the Nth CAM cell by the input signal. Within the compare drive clock, the compare operations of all the N memory CAM cells in the same row are executed. Since only a specific CAM cell is turned on each time, the power consumption is significantly reduced.

In the CAM apparatus and the operation method thereof provided by the invention, if the compare operations of a large number of memories have to be performed simultaneously, multiple CAM arrays can be applied to enhance the operation efficiency. The above external compare clocks cannot be partitioned into infinite amounts of clocks. For example, if each compare operation requires 150 ns, and if the operation time of each CAM cell in the same row is 8 ns, the maximum amount of CAM cells in one row is 16. To perform compare operation on a large amount of memories, the invention provides a synchronous compare operation for multiple CAM arrays. Therefore, the above problem can be resolved, and the amount of the CAM cells can be significantly expanded. This is further described in FIG. 6.

In the CAM apparatus provided by the invention, the CAM memory cells can use a normal SRAM. In addition, the CAM cells are also suitable for the SRAM that can maintain stored data via refresh operation such as the one-transistor SRAM (1T-SRAM) or the two-transistor-one-capacitor SRAM (2T1C-SRAM). Thus, the fabrication cost can be greatly reduced. This embodiment is further described as follows.

Figure 3:
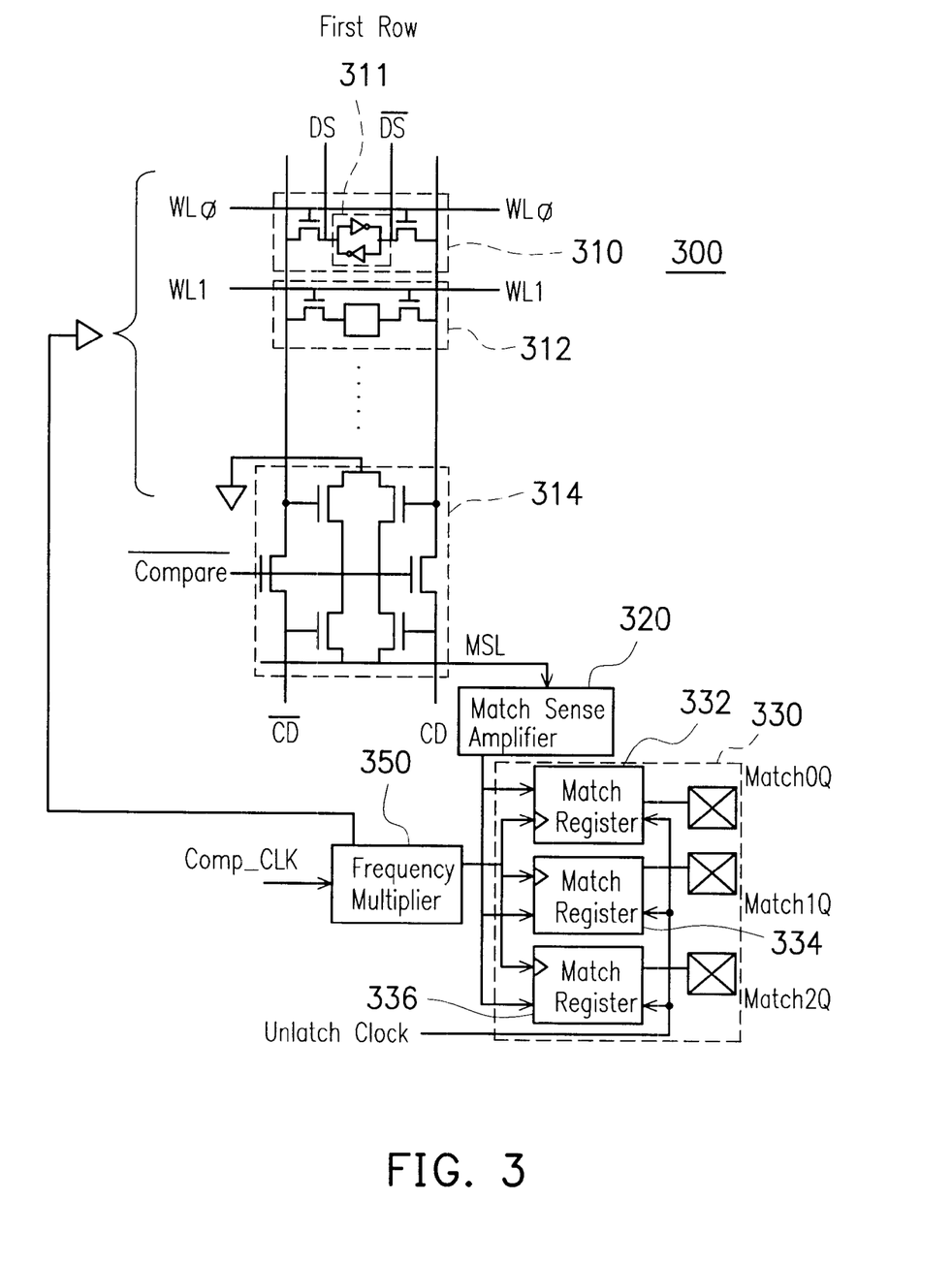
FIG. 3 shows an embodiment of the CAM apparatus according to the invention.

To further describe the CAM apparatus provided by the invention, reference is made to FIG. 3, in which an embodiment is illustrated. In this embodiment, only the first row with a plurality of CAM cells of the CAM apparatus 300 is introduced. This row comprises a first CAM cell 310 and a second CAM cell 320. Each CAM cell comprises the corresponding word line. For example, the first CAM cell 310 and the second CAM cell 312 comprise the word lines WL0 and WL1. It is appreciate the actual CAM apparatus comprises a plurality of rows of CAM cells, and can receive a plurality of bits in parallel to achieve the compare operation simultaneously.

In addition, the CAM apparatus 300 further comprises a match sense amplifier 320 and an encoder 330. The match sense amplifier 320 is used to sense and amplify a match signal transmitted from a matching sense line (MSL). The encoder 330 includes a match register set. The match register set comprises a plurality of match registers, such as match registers 332, 334 and 336. The match registers 332, 334 and 336 are used to receive and temporarily store the amplified match signal transmitted from the match sense amplifier 320. Match registers 332, 334 and 336 each comprise a terminal Match0Q, Match1Q and Match2Q, respectively. In FIG. 3, each of the match registers 332, 334 and 336 is coupled to an external unlatch clock to determine whether the match signal is output from these terminals Match0Q, Match1Q and Match2Q.

A frequency multiplier 350 is further included to receive the external compare clock, that is, to receive the compare drive clock Comp_CLK for entering the compare mode. The drive clock $\overline{\text{Compare}}$ is inverted from the compare drive clock to avoid any read or write operation by accessing the SRAM memory cells.

The CAM apparatus 300 further comprises a plurality of bit lines to receive the data to be compared (the comparand data), such as the data lines CD and $\overline{\text{CD}}$. This pair of data lines CD and $\overline{\text{CD}}$ is used to transmit different data from a single bit instead of transmitting a two-bit data. That is, if the bit line CD is a high potential level (logic 1), the other bit line $\overline{\text{CD}}$ is a low potential level (logic 0).

When receiving the compare drive clock Comp_CLK for performing the compare operation, that is, when the SRAM mode is entering the compare mode, the frequency multiplier 350 multiplies the frequency of the compare drive clock Comp_CLK by a certain numeric. The certain numeric is determined by the number of CAM cells belonging to each row of the CAM array. For example, if each row comprises N CAM cells, the received external compare drive clock is partitioned into N clock signals. That is, the frequency of the compare drive clock is N-times multiplied and converted into an internal compare clock.

According to the internal compare clock, the N CAM cells in the same row turn on the corresponding word lines WL, one by one. For example, the first internal compare clock turns on the first word line $WL_0$, and performs a compare operation on the input signal and the first CAM cell 310. The second internal compare clock turns on the second word line $WL_1$, and performs a compare operation on the input signal and the second CAM cell 312. In the above method, within the compare drive clock, the compare operations on all the CAM cells in the row are performed. Since only one specific CAM cell is turned on at one time, the consumed power is significantly reduced.

The conventional CAM cell is divided into two portions. One is the SRAM portion comprising 6 transistors; the other is the tag-compare portion comprising 4 transistors. The whole CAM cell requires 10 transistors. In contrast, in the CAM apparatus 300 of the invention, the CAM cells of each row share the tag-compare portion 314. That is, the fabrication cost is greatly reduced. Because clock turns on only one specific CAM cell instead of turning the whole row of the CAM cells at once, the reduction of power consumption is remarkable.

Figure 4:
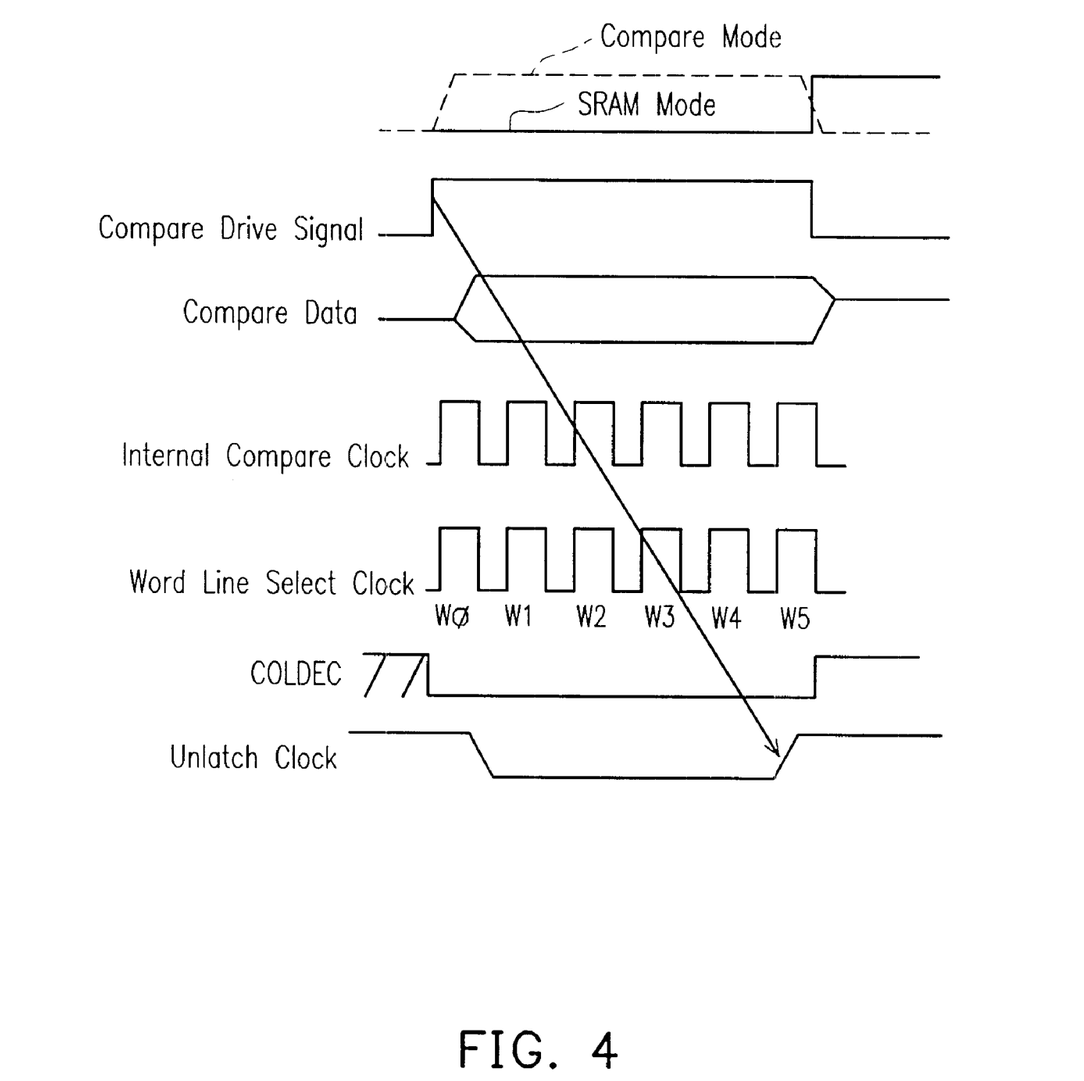
FIG. 4 shows the clock diagram used for the CAM apparatus provided by the invention.

The clock used by the CAM apparatus 300 illustrated in FIG. 3 is shown in FIG. 4. In FIG. 4, each row of the CAM array comprises 6 CAM cells. The compare drive signal is converted into an internal compare clock with 6 clocks at the same time, and is further converted into a word line select clock to complete the compare operations, one by one.

The CAM apparatus 300 illustrated in FIG. 3 is related to a CAM apparatus with a first CAM cell 310 and a second CAM cell 320. The SRAM portion of each CAM cell normally comprises 6 transistors. However, this embodiment of the invention is also applicable to an SRAM with 4 transistors, an SRAM with two transistors and one capacitor 2T1C-SRAM, or the lately developed SRAM with one transistor 1T1C-SRAM.

Figure 5:
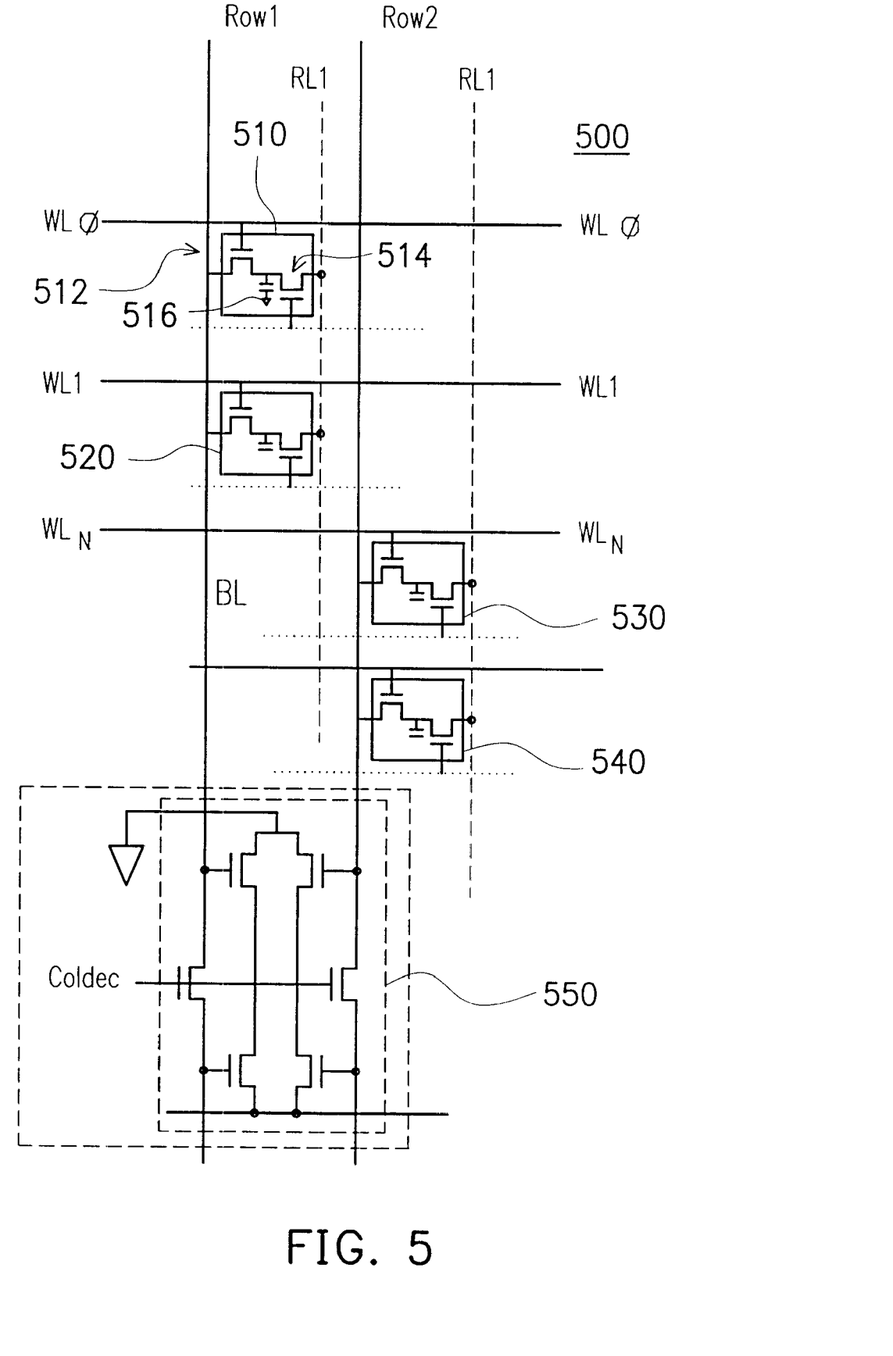
FIG. 5 shows another embodiment of the CAM apparatus provided by the invention.

FIG. 5 shows another embodiment of CAM apparatus 500 according to the invention, in which an SRAM with two transistors and one capacitor is used. In FIG. 5, each CAM cell 510 comprises two transistors and one capacitor. For example, the first CAM cell 510 comprises transistors 512 and 514, and the capacitor 510c. Similarly, the second CAM cell 520 also comprises two transistors and one capacitor. In the first row ROW1, a tag-compare portion 550 is included for performing the compare operation of the first row ROW1. The column enable signal Coldec is used to select which row is to perform the compare operation. The signal (bit) to be compared is transmitted via the bit lines BL and ABL. As mentioned above, the pair of bit lines BL and ABL is used to transmit the different data of one single bit instead of transmitting data of two bits.

The first CAM cell 510 and the second CAM cell 520 are connected to word lines WL0 and WL1, respectively. In addition, the CAM cells in the same row are also connected to a first refresh line (RL) RL1 to maintain the data content stored in the SRAM. The CAM cells such as the CAM cells 530 and 540 as illustrated of the other row are also connected to another refresh line RL2 to maintain the data content retained in the SRAM. Accordingly, the CAM cells of each row of the CAM apparatus 500 are connected to a refresh line to perform the refresh operation.

According to the above, the conventional CAM cell can use two transistors and one capacitor, or one transistor to construct the SRAM (2T1C-SRAM) or (1T1C-SRAM). However, the CAM array provided by the invention requires only one tag-compare portion. That is, the CAM cells of each row can share a common tag-compare portion to reduce greatly the fabrication cost. As each clock turns only a specific CAM call, unlike the conventional CAM array that must turn on all the CAM cells in the row, the power consumption is significantly reduced.

Figure 6:
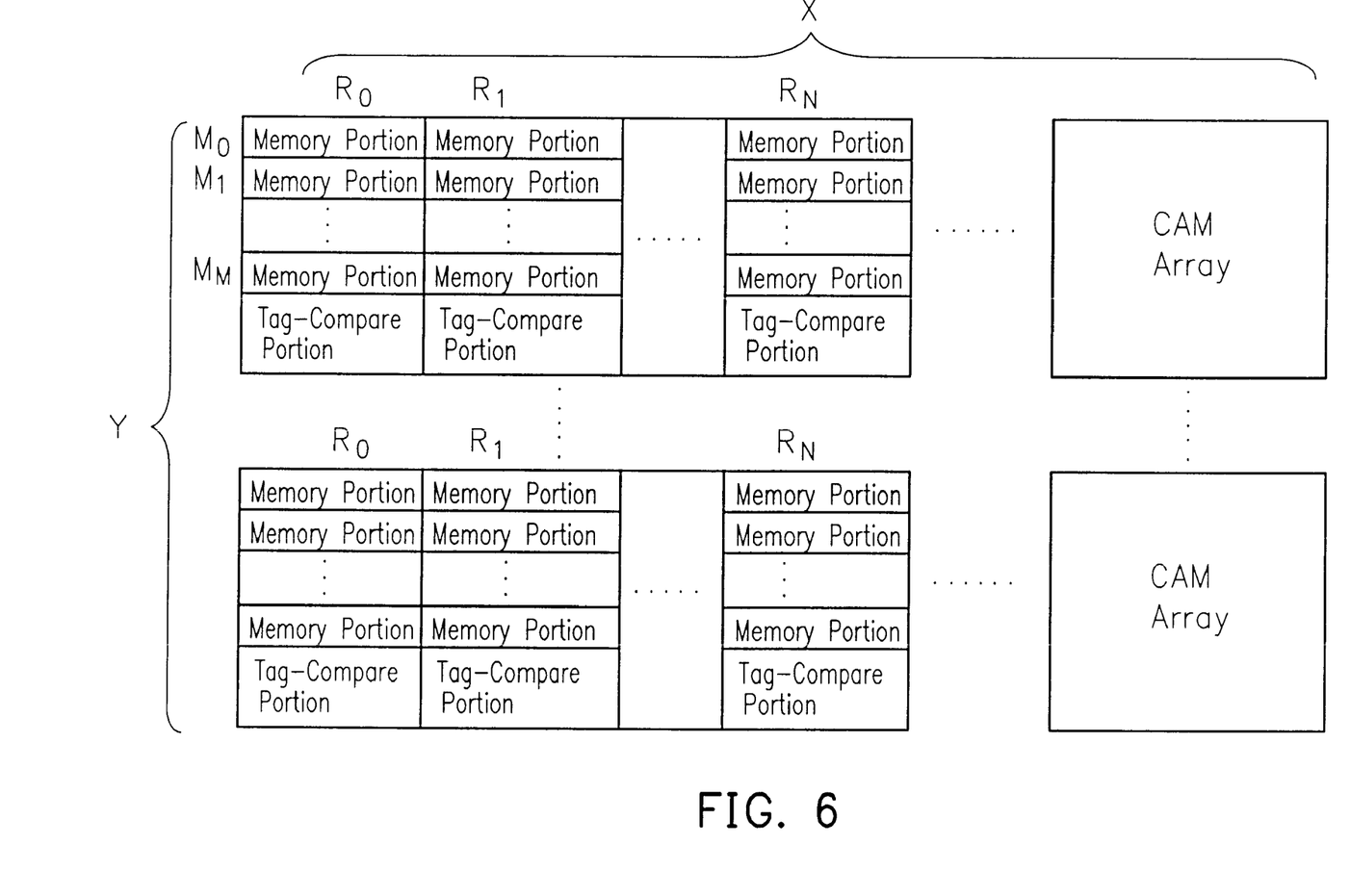
FIG. 6 shows another embodiment of the CAM apparatus provided by the invention.

The CAM apparatus provided by the invention comprises an X×Y array as shown in FIG. 6. Each CAM array includes N rows of CAM cells, and the number of CAM cells in each row is M. The M CAM cells in the same row share a common tag-compare portion. With such arrangement, the number of the CAM cells (that is, M) is determined according to the clock frequency of the compare drive signal of the system. According to the bit number of the comparand data, the number of the rows (that is, N) is determined. Alternatively, the CAM array can be expanded according to specific requirement. The above is only an example of the invention; in practical application, the arrangement of the CAM array and the CAM cell allocation in each row of the CAM array can be adjusted according to specific requirements.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A content addressable memory apparatus, comprising:
   a memory array, comprising a memory cell row, the memory cell row further comprising a plurality of memory portions and a tag-compare portion, wherein each of the memory portions is used to store bit data, the tag-compare portion is used to receive a compare data signal, and the memory portions are connected to the tag-compare portion in parallel to compare the compare data signal with the bit data stored in the memory portions; and
   a frequency multiplier, to receive an external drive signal, and to output an internal compare signal after multiplying a frequency of the external drive signal by a numeric, wherein the tag-compare portion sequentially compares the compare data signal with the bit data of each memory cell portion and outputs a match signal.

2. The content addressable memory apparatus according to claim 1, further comprising a plurality of word lines, each word line being connected to a memory portion corresponding to the memory cell row, wherein the word lines sequentially perform electric connection between the memory portions and the tag-compare portion.

3. The content addressable memory apparatus according to claim 2, further comprising a match register to receive and temporarily store the match signal.

4. The content addressable memory apparatus according to claim 3, further comprising a match sense amplifier located between the memory cell row and the match register to sense, receive, output and amplify the match signal.

5. The content addressable memory according to claim 1, wherein the memory portions comprise a static random access memory.

6. The content addressable memory according to claim 5, wherein the static random access memory comprises two transistors and one capacitor.

7. The content addressable memory according to claim 6, further comprising a refresh line coupled to the memory portions to maintain the data stored in the static random access memory via a refresh operation.

8. The content addressable memory according to claim 5, wherein the static random access memory comprises one transistor and one capacitor.

9. The content addressable memory according to claim 8, further comprising a refresh line coupled to the memory portions to maintain the data stored in the static random access memory via refreshing.

10. A content addressable memory apparatus, comprising:
a memory cell array, comprising a plurality of memory cell rows, each memory cell row further comprising a plurality of memory portions and a tag-compare portion, wherein each memory portion is used to store bit data, the tag-compare portion is used to receive a compare data signal and to compare the compare data signal with the bit data stored in the memory portions, and the memory portions are connected to the tag-compare compare portion in parallel; and
a frequency multiplier, to receive an external drive signal and to output an internal compare signal after multiplying a frequency of the external drive signal by a numeric, wherein the tag-compare portion of each memory cell row compares the compare data signal with the bit data stored in each memory portion sequentially according to a clock of the internal compare signal, and outputs a match signal.

11. The content addressable memory apparatus according to claim 10, further comprising a plurality of word lines, each word line being connected to the memory portion corresponding to the memory cell row, wherein the word lines sequentially perform electric connection between the memory portions and the tag-compare portion.

12. The content addressable memory apparatus according to claim 11, further comprising a match register to receive and temporarily store the match signal.

13. The content addressable memory apparatus according to claim 12, further comprising a match sense amplifier located between the memory cell row and the match register to sense, receive, output and amplify the match signal.

14. The content addressable memory according to claim 10, wherein the memory portions comprise a static random access memory.

15. The content addressable memory according to claim 14, wherein the static random access memory comprises two transistors and one capacitor.

16. The content addressable memory according to claim 15, further comprising a refresh line coupled to the memory portions to maintain the data stored in the static random access memory via a refresh operation.

17. The content addressable memory according to claim 14, wherein the static random access memory comprises one transistor and one capacitor.

18. The content addressable memory according to claim 17, further comprising a refresh line coupled to the memory portions to maintain the data stored in the static random access memory via refreshing.

19. A method of operating a content addressable memory apparatus comprising at least a memory cell row, each of which further comprises a plurality of memory portions and a tag-compare portion, wherein the tag-compare portion receives a compare data signal, the method comprising:
receiving a drive signal and outputting an internal compare signal after multiplying a frequency of the drive signal by a numeric; and
sequentially comparing the compare data signal with bit data stored in each memory portion according to a clock of the internal compare signal by the tag-compare portion and outputting a match signal.

20. The method according to claim 19, wherein the content addressable memory apparatus further comprises a plurality of word lines, each word line being connected to the memory portion corresponding to the memory cell row, the word lines electrically connecting the memory portions with the tag-compare portion according to the clock of the internal compare signal.

21. The method according to claim 20, wherein the memory portions comprise a static random access memory.

22. The method according to claim 21, wherein the static random access memory comprises two transistors and a capacitor.

23. The method according to claim 22, further comprising a periodic refresh operation to maintain the data stored in the static random access memory.

24. The method according to claim 21, wherein the static random access memory comprises one transistor and one capacitor.

25. The method according to claim 21, further comprising a periodic refresh operation to maintain the data stored in the static random access memory.

* * * * *